United States Patent
Jumani et al.

(10) Patent No.: US 10,846,097 B2
(45) Date of Patent: Nov. 24, 2020

(54) MISPREDICT RECOVERY APPARATUS AND METHOD FOR BRANCH AND FETCH PIPELINES

(71) Applicant: Samsung Electronics Co., Ltd., Suwon-si (KR)

(72) Inventors: Reshma C. Jumani, Austin, TX (US); Fuzhou Zou, Austin, TX (US); Monika Tkaczyk, Austin, TX (US); Eric C. Quinnell, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 28 days.

(21) Appl. No.: 16/281,084

(22) Filed: Feb. 20, 2019

(65) Prior Publication Data

US 2020/0201651 A1 Jun. 25, 2020

Related U.S. Application Data

(60) Provisional application No. 62/783,173, filed on Dec. 20, 2018.

(51) Int. Cl.
  *G06F 9/38* (2018.01)
  *G11C 15/00* (2006.01)
  *G06F 9/30* (2018.01)

(52) U.S. Cl.
  CPC ........ *G06F 9/3861* (2013.01); *G06F 9/30061* (2013.01); *G06F 9/3806* (2013.01); *G11C 15/00* (2013.01)

(58) Field of Classification Search
  CPC .............................. G06F 9/3861; G06F 9/3806
  See application file for complete search history.

(56) References Cited

U.S. PATENT DOCUMENTS 5,796,998 A * 8/1998 Levitan ................. G06F 9/3806
  712/206
6,401,196 B1 * 6/2002 Lee ......................... G06F 9/324
  711/213

(Continued)

OTHER PUBLICATIONS

"Algorithm for Instruction Cache Arbitration Among Multiple Instruction Streams", IBM Technical Disclosure Bulletin, Aug. 1996, US, vol. No. 39, TDB-ACC-NO: NN9608113 (Year: 1996).*

(Continued)

*Primary Examiner* — Farley Abad
(74) *Attorney, Agent, or Firm* — Renaissance IP Law Group LLP

(57) ABSTRACT

The present disclosure includes a mispredict recovery apparatus, which may comprise an instruction execution unit, a branch predictor, and a misprediction recovery unit (MRU). The MRU may provide discrete cycle predictions after a misprediction redirect from the instruction execution unit. The MRU may include a branch confidence filter to generate prediction confidence information for predicted branches. The MRU may include a tag content-addressable memory (CAM). The tag CAM may store frequently mispredicting low-confidence branches, probe the misprediction redirect, and obtain the prediction confidence information from the branch confidence filter. The MRU may include a mispredict recovery buffer (MRB) to store an alternate path for frequently mispredicting low-confidence branches present in the tag CAM without storing the instructions themselves. Also disclosed is a method for recovering from mispredicts associated with the instruction fetch pipeline.

16 Claims, 10 Drawing Sheets

(56) References Cited

U.S. PATENT DOCUMENTS

| | | | |
|---|---|---|---|
| 6,757,816 B1 | 6/2004 | Yoaz et al. | |
| 7,363,477 B2 | 4/2008 | Srinivasan et al. | |
| 9,477,478 B2* | 10/2016 | Kothari | G06F 9/30061 |
| 10,083,041 B2* | 9/2018 | Abdallah | G06F 9/30058 |
| 2005/0138480 A1* | 6/2005 | Srinivasan | G06F 9/3842 |
| | | | 714/38.1 |

OTHER PUBLICATIONS

"Assigning Confidence to Conditional Branch Predictions", Erik Jacobsen, Eric Rotenberg, and J. E. Smith (Year: 1996).*

Grunwald, Dirk et al., "Confidence Estimation for Speculation Control", ISCA '98 Proceedings of the 25th annual international symposium on Computer architecture pp. 122-131, Barcelona, Spain—Jun. 27-Jul. 2, 1998.

Jacobsen, Erik et al., "Assigning Confidence to Conditional Branch Predictions", Proceedings of the 29th Annual IEEE/ACM International Symposium on Microarchitecture. MICRO 29, Dec. 2-4, 1996.

Jimenez, Daniel A., "Composite Confidence Estimators for Enhanced Speculation Control", 2009 21st International Symposium on Computer Architecture and High Performance Computing, Oct. 28-31, 2009.

* cited by examiner

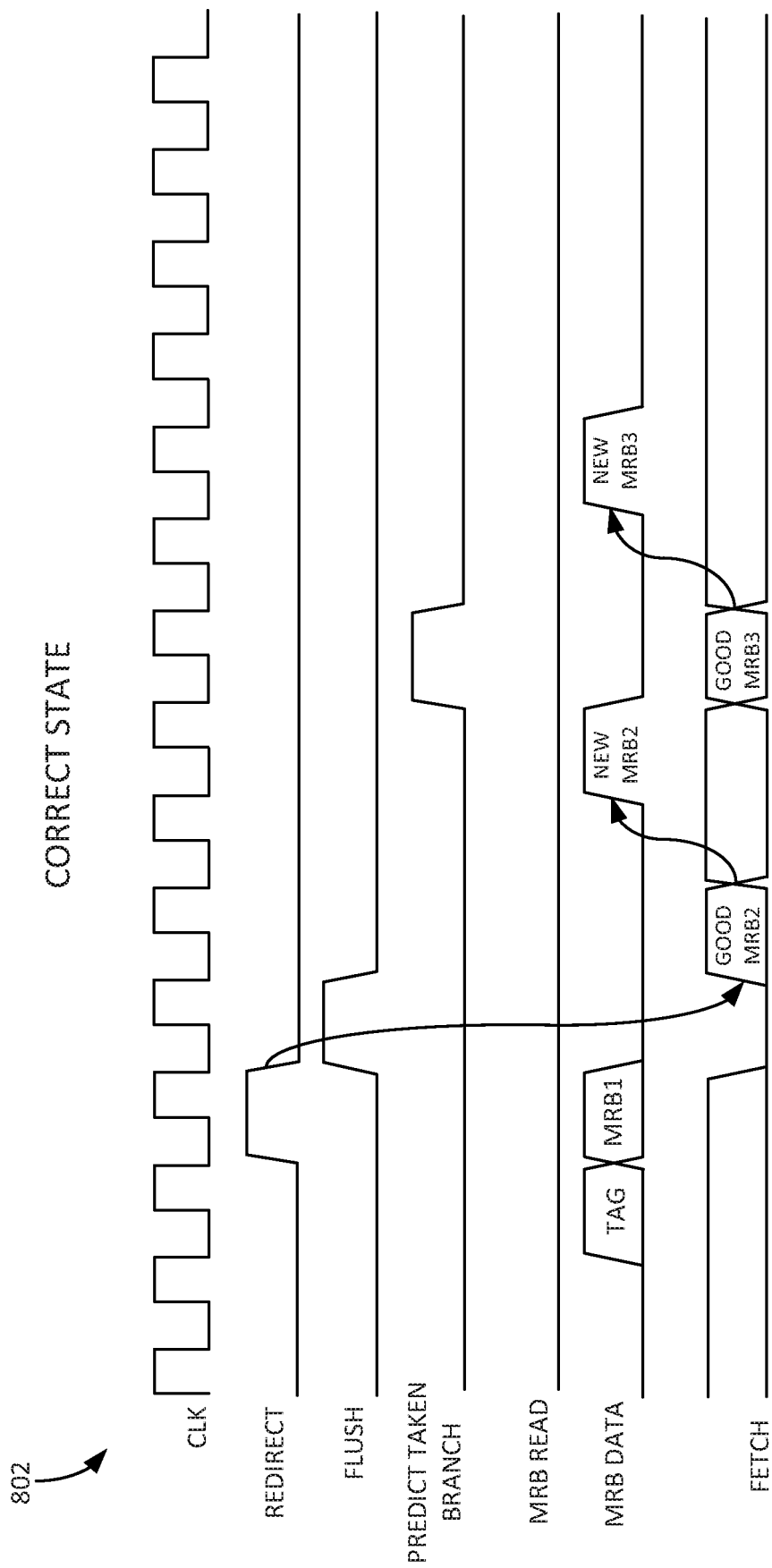

MISPREDICT RECOVERY APPARATUS AND METHOD FOR BRANCH AND FETCH PIPELINES

RELATED APPLICATION DATA

This application claims the benefit of U.S. Provisional Application Ser. No. 62/783,173, filed on Dec. 20, 2018, the contents of which is hereby incorporated by reference in its entirety.

BACKGROUND

The present disclosure relates to integrated circuits, and more particularly, to an mispredict recovery apparatus and method for branch and fetch pipelines of a microprocessor.

Central processing unit (CPU) performance is heavily dependent on accurate branch prediction. Processors employ complex branch predictor units to better use CPU resources, improve performance, and reduce wasted power. Although such predictors are able to achieve a very high accuracy, they typically use multiple cycles to predict branches, resulting in a penalty for "taken" branches. Even with a highly accurate predictor, a subset of branches remain hard to predict and are frequently mispredicted.

Branch mispredicts are very expensive, especially in deeper pipeline processors, since they require that the entire pipeline be flushed. The branch predictor latency commonly becomes the bottleneck of the CPU, with the predictor needing to catch up to fill an empty pipe after a misprediction. The mispredict latency (or penalty) may be understood as the number of cycles taken to execute an instruction followed by the mispredicted branch that was forced to redirect the fetch pipe. This is not only dependent on the branch prediction pipe/latency, but also other events such as cache misses, which can further hurt performance.

Branch predictors themselves vary in implementation and commonly trade accuracy with latency. Should a branch predictor predict a branch as taken, it redirects the branch and fetch pipe to start from a new address, and thus may suffer what is known as the taken bubble penalty, representing lost or highly speculative fetch cycles waiting for the next prediction. This penalty is seen when no back pressure exists elsewhere in the machine to cover for the bubbles. A misprediction flushes the pipeline, and thus directly exposes the machine to the taken bubble penalties for the time immediately following the misprediction.

BRIEF SUMMARY

Inventive aspects include a mispredict recovery apparatus. The mispredict recovery apparatus may include one or more instruction execution units. The mispredict recovery apparatus may include one or more branch predictors. The mispredict recovery apparatus may include a misprediction recovery unit (MRU) coupled to the one or more instruction execution units and to the one or more branch predictors, and configured to provide discrete cycle predictions after a misprediction redirect from the one or more instruction execution units.

The MRU may include a branch confidence filter configured to generate prediction confidence information for predicted branches based on information from the one or more branch predictors and on the misprediction redirect from the one or more instruction execution units. The MRU may include a tag content-addressable memory (CAM). The tag CAM may store frequently mispredicting low-confidence branches, probe the misprediction redirect from the one or more instruction execution units, and obtain the prediction confidence information from the branch confidence filter associated with the frequently mispredicting low-confidence branches.

The MRU may further include a mispredict recovery buffer (MRB) configured to store an alternate path for the frequently mispredicting low-confidence branches present in the tag CAM. The MRB may drive the instruction fetch pipeline with the alternate path in response to the misprediction redirect. The MRB may store instruction addresses for the alternate path without storing instructions themselves.

Embodiments include a method for recovering from mispredicts associated with an instruction fetch pipeline. The method may include receiving a misprediction redirect from the one or more instruction execution units. The method may include providing, by a misprediction recovery unit (MRU), discrete cycle predictions after the misprediction redirect received from the one or more instruction execution units. The method may include generating, by a branch confidence filter, prediction confidence information for predicted branches based on information from one or more branch predictors and on the misprediction redirect from the one or more instruction execution units. The method may include storing, by a tag content-addressable memory (CAM), frequently mispredicting low-confidence branches. The method may include probing, by the tag CAM, the misprediction redirect from the one or more instruction execution units. The method may include obtaining, by the tag CAM, the prediction confidence information from the branch confidence filter associated with the frequently mispredicting low-confidence branches. The method may include storing, by a mispredict recovery buffer (MRB), an alternate path for the frequently mispredicting low-confidence branches present in the tag CAM.

Certain of the inventive features may be best achieved by implementing them in a graphics processing unit (GPU), or within a processor core. Other types of processors or application specific integrated circuits (ASICs) can implement the inventive principles disclosed herein. The inventive concepts may be implemented within processors and/or memory modules of a variety of mobile devices such as smart phones, tablets, notebook computers, or the like, or in a variety of stationary devices such as desktop computers, routers, or the like.

BRIEF DESCRIPTION OF THE DRAWINGS

The foregoing and additional features and advantages of the present inventive principles will become more readily apparent from the following detailed description, made with reference to the accompanying figures, in which:

FIG. 8B illustrates an example waveform diagram of a correct state in accordance with embodiments disclosed herein.

DETAILED DESCRIPTION

Figure 1:
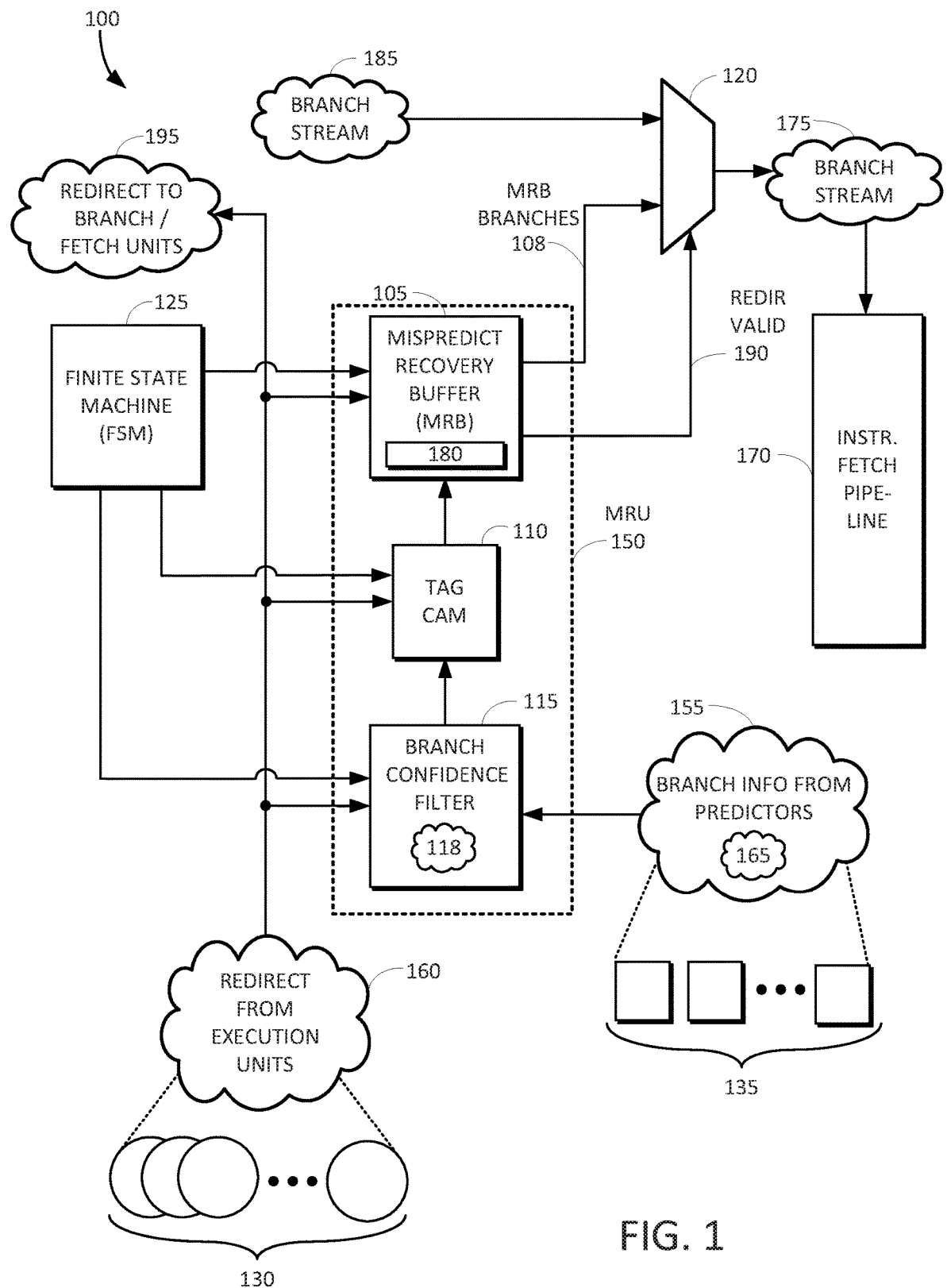
FIG. 1 illustrates an example block diagram of a mispredict recovery apparatus including a mispredict recovery buffer in accordance with embodiments disclosed herein.

Reference will now be made in detail to embodiments of the inventive concept, examples of which are illustrated in the accompanying drawings. In the following detailed description, numerous specific details are set forth to enable a thorough understanding of the inventive concept. It should be understood, however, that persons having ordinary skill in the art may practice the inventive concept without these specific details. In other instances, well-known methods, procedures, components, circuits, and networks have not been described in detail so as not to unnecessarily obscure aspects of the embodiments.

It will be understood that, although the terms first, second, etc. may be used herein to describe various elements, these elements should not be limited by these terms. These terms are only used to distinguish one element from another. For example, a first buffer could be termed a second buffer, and, similarly, a second buffer could be termed a first buffer, without departing from the scope of the inventive concept.

The terminology used in the description of the inventive concept herein is for the purpose of describing particular embodiments only and is not intended to be limiting of the inventive concept. As used in the description of the inventive concept and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The components and features of the drawings are not necessarily drawn to scale.

Embodiments of the present disclosure include a mispredict recovery apparatus having a mispredict recovery unit (MRU). The MRU may include a mispredict recovery buffer (MRB), a tag content-addressable memory (CAM), and a branch prediction filter. With a highly accurate predictor, only a small portion of the branches are hard to predict. Further, only a subset of these are frequently mispredicted. The mispredict recovery apparatus uses any suitable predictor confidence estimator to identify low-confidence branches. The mispredict recovery apparatus then filters low-confidence branches that are frequently seen, and records/stores predictions that are highly probable immediately following the misprediction. The mispredict recovery apparatus is then able to drive the branch and fetch pipelines for a few cycles after the mispredict, fetching from previously predicted high-probability basic blocks without waiting for a current predictor outcome, and thus eliminating the taken bubble penalty. This reduction in prediction and fetch latency immediately following a low-confidence mispredicted branch provide for the actual higher latency predictor to catch up and start filling the pipe downstream. Accordingly, this forces the prediction and fetching of a range of basic blocks immediately following a mispredicted, but tagged low-confidence branch. The structure provides the most-probable basic block fetch path of each low-confidence branch, eliminating immediate predictor taken bubbles while the main predictor catches up fetching down the correct path. A significant advantage to this approach is immediate latency recovery and performance uplift on kernels with hard-to-predict branches, and with high post-misprediction accuracy.

FIG. 1 illustrates an example block diagram of a mispredict recovery apparatus 100 including a mispredict recovery buffer (MRB) 105 in accordance with embodiments disclosed herein. The mispredict recovery apparatus 100 may include a mispredict recovery unit (MRU) 150 having the mispredict recovery buffer 105. The MRU 150 may further include a tag CAM 110 and a branch confidence filter 115. The MRB 105 may be communicatively coupled to a selector 120. The select 120 may be, for example, a multiplexor. In addition, the mispredict recovery apparatus 100 may include a finite state machine (FSM) 125. The FSM 125 may control various aspects of the MRB 105, the tag CAM 110, and/or the branch confidence filter 115, as further described in detail below. The mispredict recovery apparatus 100 may further include one or more instruction execution units 130, and one or more branch predictors 135. The mispredict recovery apparatus 100 may further include an instruction fetch pipeline 170.

The branch confidence filter 115 may implement a confidence estimation technique based on branch prediction information 155 received from the one or more branch predictors 135, as well as one or more redirects 160 received from the one or more instruction execute units 130. The branch confidence filter 115 may use various metrics such as distance between mispredicts, correct versus wrong predictions within a given time interval, predictor confidence and training, and so forth. The information gathered may be global or otherwise specific to a particular branch. The branch confidence filter 115 may generate and store prediction confidence information 118 for predicted branches based on information 155 from the one or more branch predictors 135 and on redirect information 160 from the one or more instruction execution units 130.

The tag CAM 110 may store frequently mispredicting low-confidence branches. It does so by probing the redirects 160 coming from the one or more execution units 130, and obtaining confidence information such as predictor confidence estimators 165 on these branches from the one or more branch predictors 135. The MRB 105 may store one or more alternate paths 180 for the low-confidence branches present in the tag CAM 110. The term "alternate path" refers to a path that diverges from the predicted path starting from the mispredicting branch. On a mispredict, the MRB 105 drives the instruction fetch pipeline 170 with this alternate path 180. In other words, on a mispredict, a branch stream 175 after the selector 120 may be driven by the alternative path 180 stored by the MRB 105. More specifically, the MRB 105 may send MRB branches 108, which may be selected by the selector 120 based on the redirect valid signal 190. The MRB 105 may also receive feedback from the one or more branch predictors 135 to confirm if the one or more branch predictors 135 agree with the MRB 105 on these redirects. When the MRB 105 is not driving the instruction fetch pipeline 170, the usual branch stream 185 may be passed through the selector 120 to the instruction fetch pipeline 170. The selector 120 may be controlled by a redirect valid signal 190 generated by the MRB 105. Redirects 160 received from the one or more instruction execute units 130 may also be passed to branch and/or fetch units as shown at 195.

Figure 2:
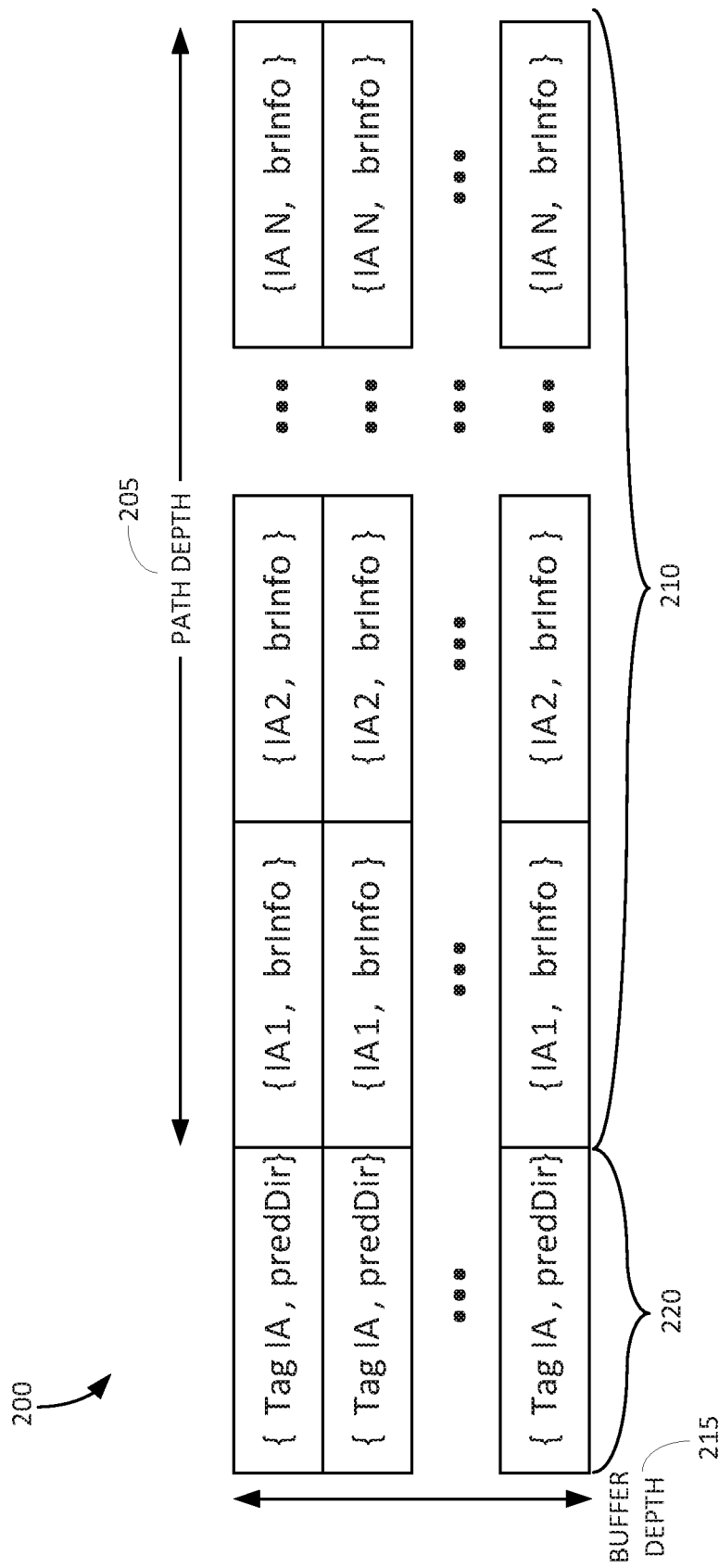
FIG. 2 illustrates an example diagram of an organization of a tag CAM in accordance with embodiments disclosed herein.

FIG. 2 illustrates an example diagram 200 of an organization of the tag CAM 110 in accordance with embodiments disclosed herein. Reference is now made to FIGS. 1 and 2.

The tag CAM 110 may store instruction branch target addresses (e.g., IA 1, IA 2, through IA N) along with associated branch information (e.g., brInfo) such as predicted directions and branch type. Entries in the tag CAM 110 may include any necessary information required to feed the instruction fetch pipeline 170. The most basic form of this includes a prediction on branches and the corresponding target IA (e.g., IA 1, IA 2, through IA N) that can be used to redirect the instruction fetch pipeline 170. The sections 220 may be input into the tag CAM 110 and stored therein. MRB branch prediction records 210 may be stored in the MRB 105.

Alternate path depth 205 can be measured in terms of portions of basic blocks, such as the MRB branch prediction records 210. The MRB branch prediction records 210 each include a stream of instructions that start with a target of a branch, or a new sequential cache line, and ends with a taken branch, or the end of the cache line. Each of the MRB branch prediction records 210 may include one or more instruction streams terminating at a taken branch or end of a cacheline. The MRB branch prediction records 210 provide the most probable prediction path of which branch to follow next, and where it goes.

The desired path depth 205 depends on the depth of the branch pipe or latency associated with the one or more branch predictors 135. Since the one or more predictors 135 are more accurate on average than the MRB 105, the one or more branch predictors 135 may take over as soon as a sufficient number of instructions have been sent out downstream (i.e., to the branch stream 175). The organization of the tag CAM 110 also factors in a buffer depth 215, or in other words, the number of low-confidence branches being tracked and stored in the tag CAM 110.

The maximum number of branches that may be predicted by the MRB 105 is equal to the path depth 205. Since each branch may have a taken or not-taken outcome, there are at least two possible alternate paths, each having the path depth 205. More specifically, the number of permutations is 2^(path depth 205). For example, a depth of three has eight possible paths (i.e., branches), such as with a tree where each branch goes two ways, and each of those ways also goes two ways, and so forth. In some embodiments, only one such branch within the tree is recorded in the MRB 105. When there are sequential lines in the path, this number of possible alternate paths reduces accordingly. The MRB 105, however, endeavors to store the most probable path. The more-accurate one or more branch predictors 135 may confirm and/or redirect the MRB 105, although it would be able do so at a much slower rate. When a redirect occurs while the MRB 105 is still predicting, the MRB 105 may stop driving the instruction fetch pipeline 170. When a path determined by the one or more branch predictors 135 has a higher probability of being taken, the one or more alternate paths 180 stored in the MRB 105 may be updated. The MRB 105 may thereby train itself to minimize future redirects.

Example embodiments disclosed herein may identify frequently mispredicted branches and provide discrete cycle predictions to the instruction fetch pipeline 170 for a short duration immediately after a misprediction redirect, thereby increasing branch throughput and hiding the taken bubble penalty. The MRU 150 may use predictor confidence estimators 165 directly from the one or more branch predictors 135 to identify low-confidence branches. The MRU 150 may then identify low-confidence branches that are frequently seen, and may record or otherwise store the predictions (i.e., one or more alternate paths 180) that are highly probable immediately following the misprediction. The MRB 105 may drive the branch stream 175 and/or the instruction fetch pipeline 170 for a few cycles after the mispredict, fetching already-predicted high-probability basic blocks without waiting for a current predictor outcome from the one or more branch predictors 135, and thus eliminating the taken bubble penalty.

Since the MRB 105 may drive the branch stream 175, in some embodiments the longer-latency branch predictors 135 may be fed the path data (i.e., MRB branches 108) as inputs, and may thus make a prediction correction before the instructions are resolved in downstream execution. This reduces the penalty of subsequent bad predictions from the MRU 150.

The MRB 105 may store and drive basic block branch predictions only, and does not store instructions themselves. This allows for a small and simple implementation with large instruction footprint coverage, although at the cost of still fetching actual instructions from the instruction addresses.

Example embodiments disclosed herein increase post-mispredict throughput, but does not necessarily decrease mispredict latency. Not-taken predictions need not be recorded in the MRB 105. Moreover, always-taken branches need not be verified downstream, allowing for multiple takens for a given cycle.

The tag CAM 110 may use a replacement policy to filter out frequently mispredicting branches and replace the infrequent ones with new mispredicts. Branches which have higher weight (i.e., frequent mispredicting) entries may remain in the tag CAM 110 for as long as they continue to mispredict, whereas low-weight (i.e., infrequent mispredicting) entries are replaced over time. Every redirect that hits in the tag CAM 110 increments its corresponding weight. Once any weight saturates or when the CAM 110 becomes full, the weights may be decremented or scaled down to be able to identify tags that aren't being accessed as often.

Figure 3:
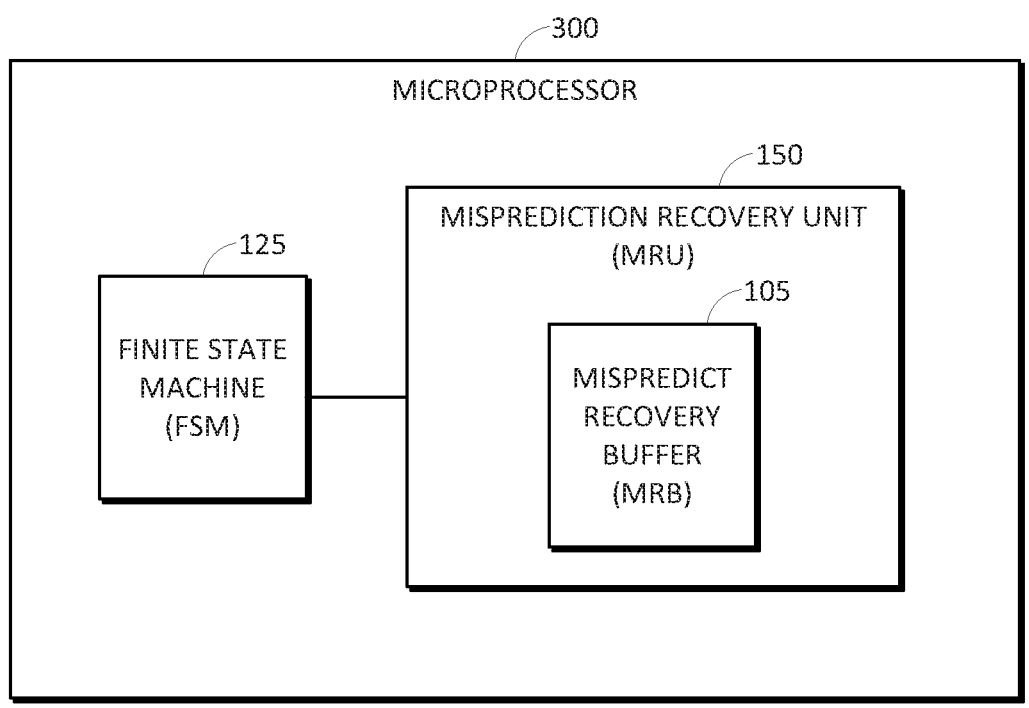
FIG. 3 illustrates an example block diagram of a microprocessor including a misprediction recovery unit (MRU) in accordance with embodiments disclosed herein.

FIG. 3 illustrates an example block diagram of a microprocessor 300 including the MRU 150 in accordance with embodiments disclosed herein. The microprocessor 300 can be any suitable processor such as an ARM processor, a RISC processor, an x86 processor, or the like. The microprocessor 300 may include the FSM 125 as described herein. The microprocessor 300 may include the MRU 150 as described herein. The MRU 150 may include the MRB 105 as described herein.

Figure 4:
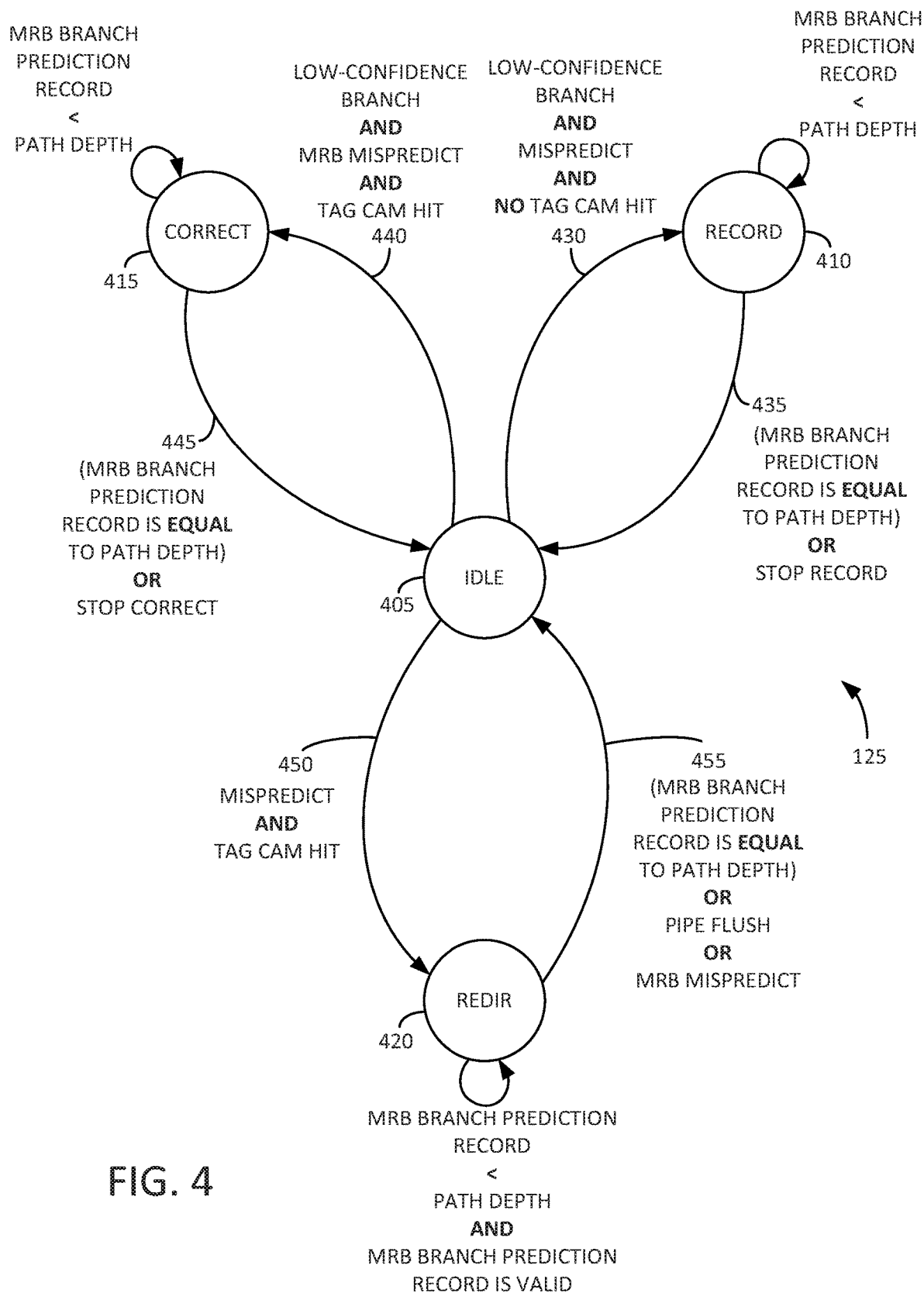
FIG. 4 illustrates an example finite state machine used to control the mispredict recovery buffer in accordance with embodiments disclosed herein.

FIG. 4 illustrates an example finite state machine (FSM) 125 used to control the mispredict recovery buffer 105 in accordance with embodiments disclosed herein. Reference is now made to FIGS. 1 and 4.

In the idle state 405, the FSM 125 is idle. In the record state 410, the FSM 125 is creating a new entry in the tag CAM 110 and storing the corresponding alternate path 180 in the MRB 105. In the correct state 415, based on feedback from the one or more branch predictors 135, the FSM 125 is replacing an existing alternate path 180 in the MRB 105 with a higher probability alternate path 180. In the redirect state 420, the FSM 125 may issue a read from the MRB 105 on a mispredict and uses the data to redirect the instruction fetch pipeline 170.

For the sake of simplicity, transitions to the record state 410, the correct state 415, and the redirect state 420 may only be allowed from the idle state 405. In an alternate embodiment, a more complex state machine may be used to prioritize between states without reverting to the idle state 405.

The FSM 125 may transition from the idle state 405 to the record state 410 at 430, when a particular branch is a low-confidence branch AND there is a mispredict AND there is no hit in the tag CAM 110. The FSM 125 may remain in the record state 410 when a particular MRB branch prediction record is LESS THAN the path depth (e.g., 205 of FIG. 2). The FSM 125 may transition from the record state 410 back to the idle state 405 at 435 when a particular MRB branch prediction record is EQUAL to the path depth (e.g., 205 of FIG. 2) OR in response to a stop record command.

The FSM 125 may transition from the idle state 405 to the correct state 415 at 440 when a particular branch is a low-confidence branch AND there is an MRB mispredict AND there is a hit in the tag CAM 110. The FSM 125 may remain in the correct state 415 when a particular MRB branch prediction record is LESS THAN the path depth (e.g., 205 of FIG. 2). The FSM 125 may transition from the correct state 415 back to the idle state 405 at 445 when a particular MRB branch prediction record is EQUAL to the path depth (e.g., 205 of FIG. 2) OR in response to a stop correct command.

The FSM 125 may transition from the idle state 405 to the redirect state 420 at 450 when there is a mispredict AND there is a hit in the tag CAM 110. The FSM 125 may remain in the redirect state 420 when a particular MRB branch prediction record is LESS THAN the path depth (e.g., 205 of FIG. 2) AND a MRB branch prediction record is valid. The FSM 125 may transition from the redirect state 420 back to the idle state 405 at 455 when a particular MRB branch prediction record is EQUAL to the path depth (e.g., 205 of FIG. 2) OR in response to a pipe flush OR in response to an MRB mispredict.

Figure 5:
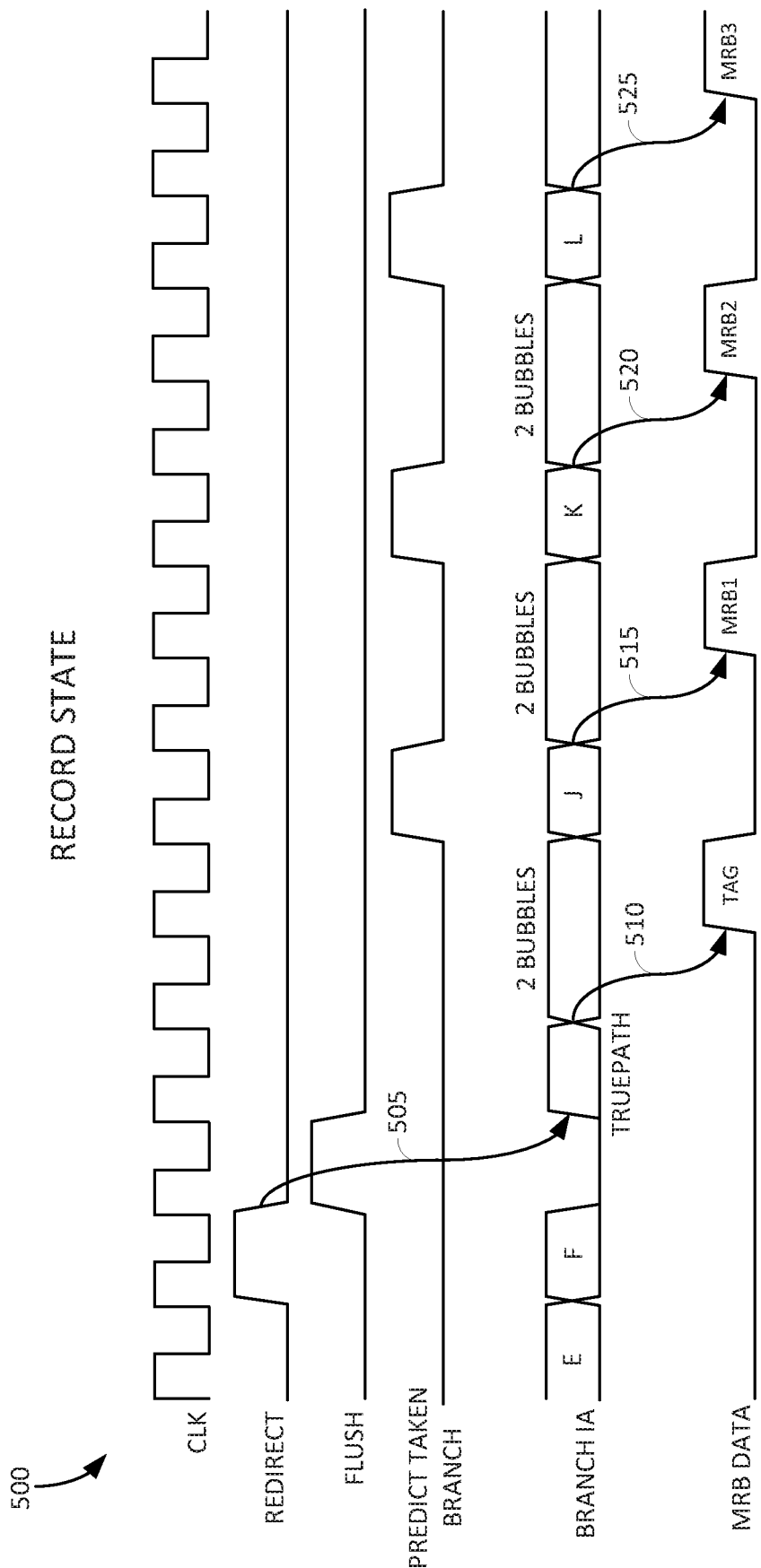
FIG. 5 illustrates an example waveform diagram of a record state for the mispredict recovery buffer in accordance with embodiments disclosed herein.

FIG. 5 illustrates an example waveform diagram 500 of a record state (e.g., 410 of FIG. 4) for the mispredict recovery buffer in accordance with embodiments disclosed herein. The waveform diagram 500 shows a clock signal CLK, an example redirect waveform, an example flush waveform, an example predict taken branch waveform, an example branch IA waveform, and an example MRB data waveform.

The waveform diagram 500 shows an example timing relationship of signals while in the record state 410 for the MRB 105. This example waveform diagram 500 shows the MRU 150 recording data into the MRB 105 after an identified low-confidence misprediction is redirected. Each entry past the true path correction is a taken branch predicted with high probability. When a particular low-confidence branch is mispredicted, and it isn't already present in the tag CAM 110, it may be picked for being recorded in the MRB 105. In some embodiments, the MRU 150 picks the low-confidence branch to be recorded in the MRB 105. A corresponding tag is stored in the tag CAM 110 and assigned an initial replacement weight. The subsequent branches are stored as an alternate path 180 in the MRB 105. The example timing diagram 500 assumes a path depth of three (3). As shown in FIG. 5, in response to the redirect at 505 (i.e., a bad prediction), the branch IA waveform shows branch instructions J, K, and L with multiple 2 bubble penalties interspersed within the stream. The MRB 105 begins recording MRB data at 510, and continues at 515, 520, and 525.

Figure 6:
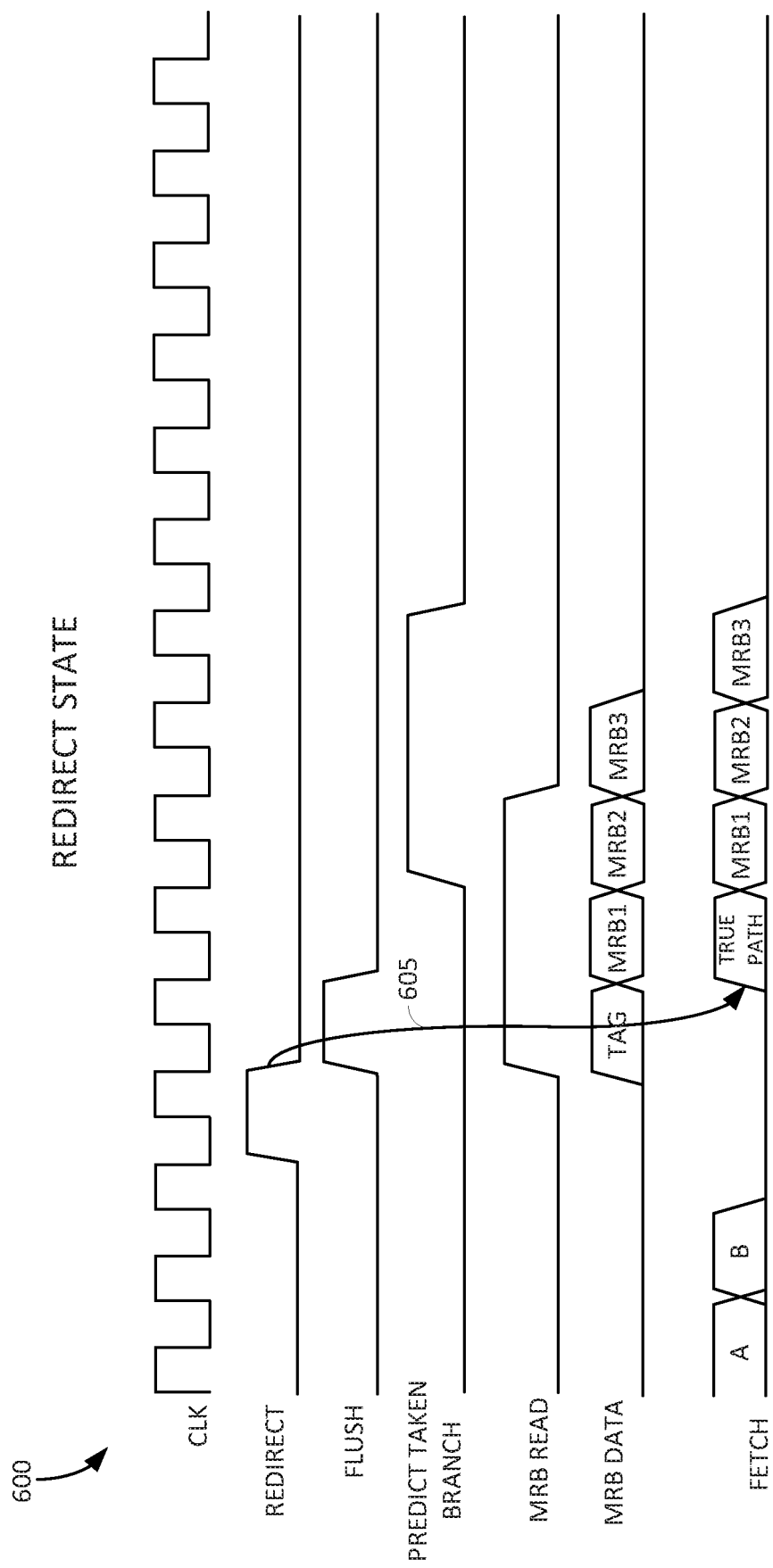
FIG. 6 illustrates an example waveform diagram of a redirect state for the mispredict recovery buffer in accordance with embodiments disclosed herein.

FIG. 6 illustrates an example waveform diagram 600 of a redirect state (e.g., 420 of FIG. 4) for the MRB 105 in accordance with embodiments disclosed herein. Reference is now made to FIGS. 1 and 6.

The waveform diagram 600 shows a clock signal CLK, an example redirect waveform, an example flush waveform, an example predict taken branch waveform, an example MRB read waveform, an example MRB data waveform, and an example fetch waveform. When a mispredicting branch hits in the MRB 105 (i.e., a previously recorded mispredict situation is detected as having occurred again), an alternate path 180 is read from the MRB 105 and driven on the instruction fetch pipeline 170. The MRB 105 can drive the branch stream 175 with no bubbles, and can predict multiple branches in the same cycle since it uses previously stored branch information. As shown in FIG. 6, in response to the redirect at 605, the fetch waveform follows the true path with MRB1, MRB2, and MRB3, and with no bubble penalties interspersed within the stream. The most important action after a misprediction is to feed the instruction fetch pipeline 170 as fast as possible without bubbles. Accordingly, the example waveform diagram 600 shows the MRU 150 activating and recovering from a low-confidence mispredict after already having recorded a high-confidence alternate.

Figure 7:
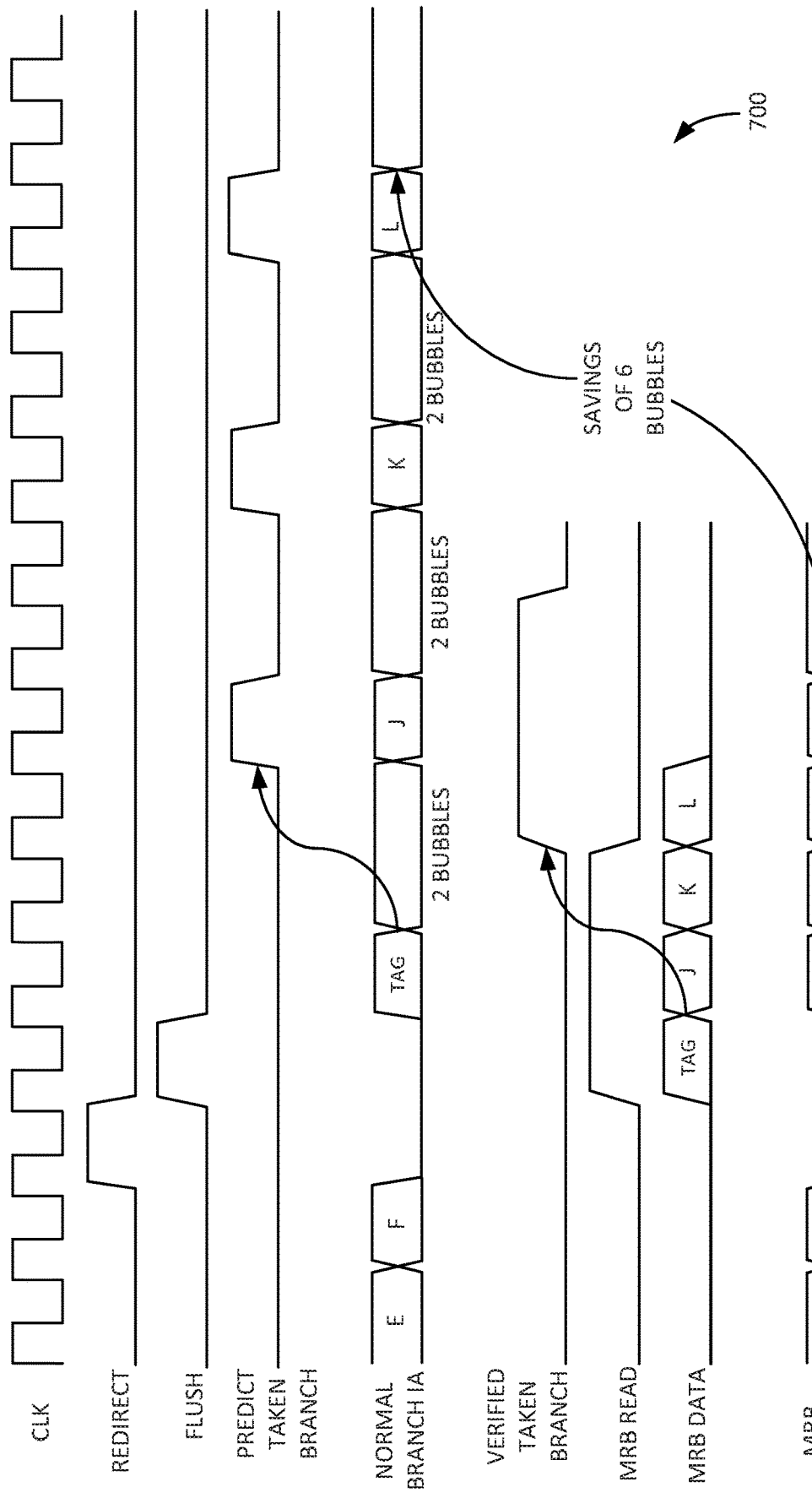
FIG. 7 illustrates an example waveform diagram showing a comparison with and without the mispredict recovery buffer in accordance with embodiments disclosed herein.

FIG. 7 illustrates an example waveform diagram 700 showing a comparison with and without the MRB in accordance with embodiments disclosed herein. Reference is now made to FIGS. 1 and 7.

The waveform diagram 700 shows a clock signal CLK, an example redirect waveform, an example flush waveform, an example predict taken branch waveform, an example normal branch IA waveform, an example verified taken branch waveform, an example MRB read waveform, an example MRB data waveform, and an example MRB branch IA waveform.

Comparing the normal branch IA stream driven by the one or more branch predictors 135 versus the MRB branch IA stream driven by the MRB 105, as can be seen in FIG. 7, the normal branch IA makes taken predictions with bubbles interspersed, i.e., driving the instruction fetch pipeline 170 with two (2) bubble penalties interspersed between each taken prediction. This incurs six (6) extra bubbles at a point where all downstream units are idle since the instruction fetch pipeline 170 has been flushed. In contrast, the MRB branch IA stream has a savings of six (6) bubbles in this example. In some embodiments, the bubble savings can be more or less than six. The waveforms include a two-cycle delay for prediction verification via the normal one or more branch predictors 135. The verified taken branch waveform indicates whether or not the one or more normal branch predictors 135 agree with the alternate path 180 from the MRB 105, and when the one or more normal branch predictors 135 disagree, then the one or more normal branch predictors 135 can cause the state to be corrected.

Figure 8A:
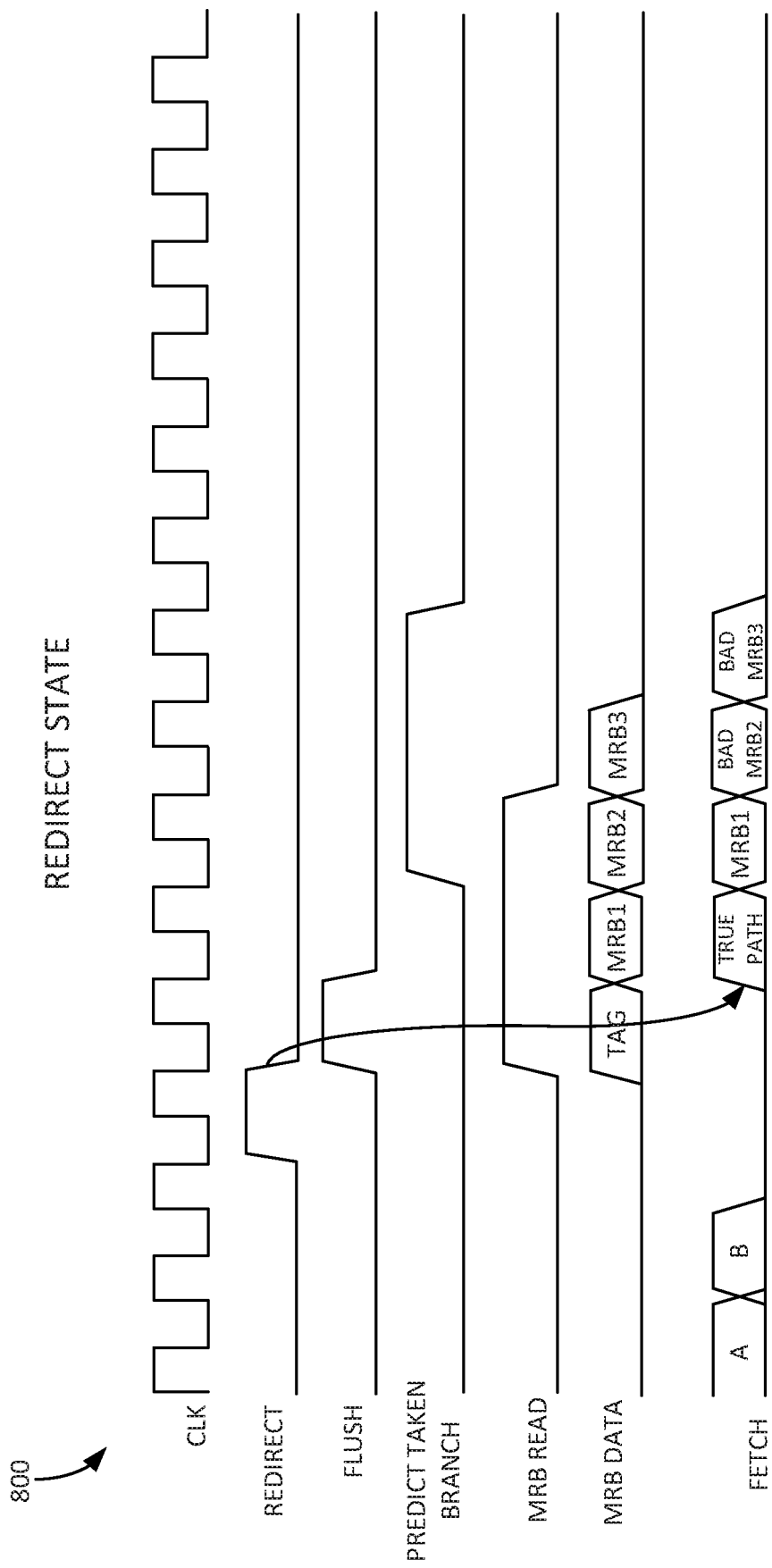
FIG. 8A illustrates an example waveform diagram of a redirect state having bad MRB data in accordance with embodiments disclosed herein.

FIG. 8A illustrates an example waveform diagram of a redirect state having bad MRB data in accordance with embodiments disclosed herein. FIG. 8B illustrates an example waveform diagram of a correct state in accordance with embodiments disclosed herein. Reference is now made to FIGS. 1, 8A, and 8B.

The waveform diagrams 800 and 802 of FIGS. 8A and 8B, respectively, show a clock signal CLK, an example redirect waveform, an example flush waveform, an example predict taken branch waveform, an example MRB read waveform, an example MRB data waveform, and an example fetch waveform. The waveform diagram 802 is a continuation of the waveform diagram 800.

The one or more branch predictors 135 may confirm whether or not the predictions that the MRB 105 redirected the instruction fetch pipeline 170 are accurate. If the one or more branch predictors 135 determine that the MRB 105 actions are inaccurate, the one or more branch predictors 135 may flush a part of the instruction fetch pipeline 170 and start over from the point of disagreement. Since the MRB 105 stores the most probable path or paths, this only happens a small fraction of the time. When the one or more branch predictors 135 considers another path to have a higher probability of being taken, the MRB 105 may fix the path stored during the correct state (e.g., 415 of FIG. 4) of the FSM 125.

In this example, as shown in FIG. 8A, the fetch path has bad MRB2 and MRB3 entries. These may be considered "bad" because the one or more branch predictors 135 has determined that the MRB 105 actions are inaccurate, or that the one or more branch predictors 135 considers another path to have a higher probability of being taken. As shown in FIG. 8B, which is a representation of the correct state (e.g., 415 of FIG. 4), the bad MRB2 and MRB3 entries are replaced with good MRB2 and MRB3 entries. These may be considered "good" because the one or more branch predictors 135 are more accurate in some cases than what is stored in the MRB 105. The "good" MRB2 and MRB3 entries can then be stored in the MRB 105 as new MRB2 and MRB3 entries, as shown in FIG. 8B. In other words, the MRB 105 may train itself to minimize future redirects by storing updated branch information.

Figure 9:
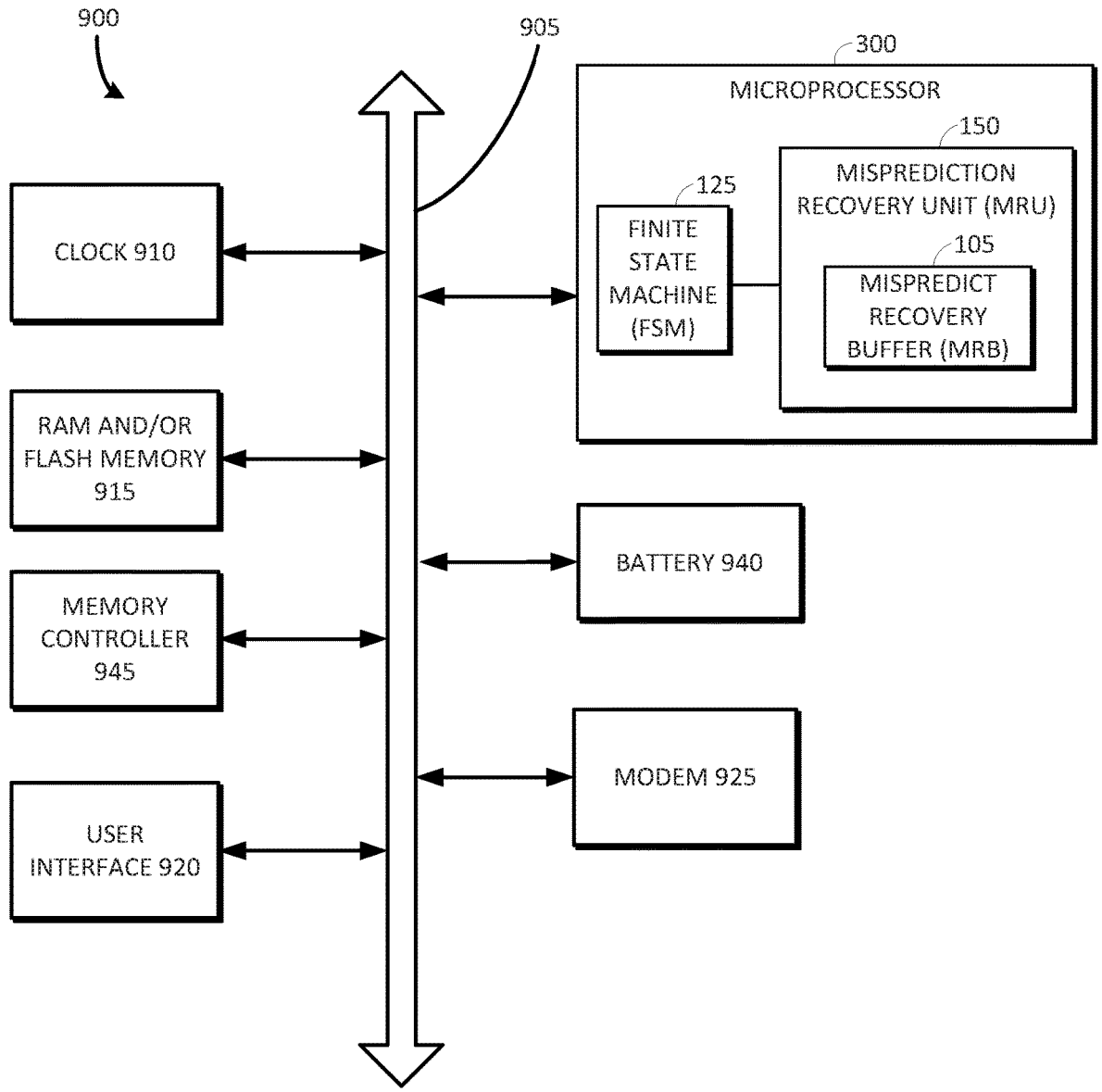
FIG. 9 is an example block diagram of a computing system including mispredict recovery buffer according to embodiments disclosed herein.

FIG. 9 is an example block diagram of a computing system 900 including the microprocessor 300 according to embodiments disclosed herein. The microprocessor 300 may be the same as the microprocessor 300 described herein, and may be electrically connected to a system bus 905. The computing system 900 may also include a clock 910, a random access memory (RAM) and/or flash memory 915, a memory controller 945, a user interface 920, a modem 925 such as a baseband chipset, and/or automated test equipment (ATE) 935, any or all of which may be electrically coupled to the system bus 905.

If the computing system 900 is a mobile device, it may further include a battery 940, which powers the computing system 900. Although not shown in FIG. 9, the computing system 900 may further include an application chipset, a camera image processor (CIS), a mobile DRAM, and the like. The memory controller 945 and the flash memory 915 may constitute a solid state drive/disk (SSD), which uses a nonvolatile memory to store data.

In example embodiments, the computing system 900 may be used as computer, portable computer, Ultra Mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting a telematics network, RFID, or one of various electronic devices constituting a computing system.

The various operations of methods described above may be performed by any suitable means capable of performing the operations, such as various hardware and/or software component(s), circuits, and/or module(s).

Inventive aspects include a mispredict recovery apparatus. The mispredict recovery apparatus may include one or more instruction execution units. The mispredict recovery apparatus may include one or more branch predictors. The mispredict recovery apparatus may include a misprediction recovery unit (MRU) coupled to the one or more instruction execution units and to the one or more branch predictors, and configured to provide discrete cycle predictions after a misprediction redirect from the one or more instruction execution units.

The MRU may include a branch confidence filter configured to generate prediction confidence information for predicted branches based on information from the one or more branch predictors and on the misprediction redirect from the one or more instruction execution units. The MRU may include a tag content-addressable memory (CAM). The tag CAM may store frequently mispredicting low-confidence branches, probe the misprediction redirect from the one or more instruction execution units, and obtain the prediction confidence information from the branch confidence filter associated with the frequently mispredicting low-confidence branches.

The MRU may further include a mispredict recovery buffer (MRB) configured to store an alternate path for the frequently mispredicting low-confidence branches present in the tag CAM. The MRB may drive the instruction fetch pipeline with the alternate path in response to the misprediction redirect. The MRB may store instruction addresses for the alternate path without storing instructions themselves.

In some embodiments, the alternate path diverges from a predicted path starting from a mispredicting branch from among the frequently mispredicting low-confidence branches.

The mispredict recovery apparatus may further comprise an instruction fetch pipeline. In response to the misprediction redirect from the one or more instruction execution units, the MRB may be configured to drive the instruction fetch pipeline with the alternate path. The MRU may be configured to provide the discrete cycle predictions to the instruction fetch pipeline from the MRB without bubble penalties. The MRB may be configured to store instruction addresses for the alternate path without storing instructions themselves. The MRB may be configured to store the alternate path immediately following the misprediction redirect. The MRB may be configured to store a plurality of alternate paths each associated with a frequently mispredicting low-confidence branch from among the frequently mispredicting low-confidence branches present in the tag CAM. The MRU may be configured to provide the discrete cycle predictions after the misprediction redirect based at least on the alternate path stored in the MRB.

The mispredict recovery apparatus may further include one or more main branch predictors. The one or more branch predictors may be configured to determine whether or not the alternate path is accurate. In response to determining that the alternate path is not accurate, the one or more branch predictors may be configured to correct the discrete cycle predictions sent to the instruction fetch pipeline. The MRU may be configured to store the corrected discrete cycle predictions.

The mispredict recovery apparatus may further include a finite state machine (FSM) configured to control the MRU, and to transition between an idle state, a record state, a redirect state, and a correct state. The FSM may be configured to transition from the idle state to the record state in response to at least the misprediction redirect. The FSM may be configured to transition from the idle state to the redirect state in response to at least the misprediction redirect and a hit in the tag CAM.

The misprediction redirect may be referred to as a first misprediction redirect. The FSM may be configured to transition from the idle state to the correct state in response to at least a second misprediction redirect associated with the MRB. The FSM may be configured to transition from the idle state to the correct state in response to at least the second misprediction redirect associated with the MRB and a hit in the tag CAM.

Embodiments include a method for recovering from mispredicts associated with an instruction fetch pipeline. The method may include receiving a misprediction redirect from the one or more instruction execution units. The method may include providing, by a misprediction recovery unit (MRU), discrete cycle predictions after the misprediction redirect received from the one or more instruction execution units. The method may include generating, by a branch confidence filter, prediction confidence information for predicted branches based on information from one or more branch predictors and on the misprediction redirect from the one or more instruction execution units. The method may include storing, by a tag content-addressable memory (CAM), frequently mispredicting low-confidence branches. The method may include probing, by the tag CAM, the misprediction redirect from the one or more instruction execution units. The method may include obtaining, by the tag CAM, the prediction confidence information from the branch confidence filter associated with the frequently mispredicting low-confidence branches. The method may include storing, by a mispredict recovery buffer (MRB), an alternate path for the frequently mispredicting low-confidence branches present in the tag CAM.

The method of claim may further include driving, by the MRB, an instruction fetch pipeline with the alternate path in response to the misprediction redirect from the one or more instruction execution units. The method of claim may further include providing, by the MRU, the discrete cycle predictions to the instruction fetch pipeline from the MRB without bubble penalties. The method of claim may further include storing, by the MRB, instruction addresses for the alternate path without storing instructions themselves. The method of claim may further include storing, by the MRB, the alternate path immediately following the misprediction redirect from the one or more instruction execution units.

The method of claim may further include determining, by the one or more branch predictors, whether or not the alternate path is accurate. The method of claim may further include in response to determining that the alternate path is not accurate, correcting, by the one or more branch predictors, the discrete cycle predictions sent to the instruction fetch pipeline. The method of claim may further include storing, by the MRU, the corrected discrete cycle predictions.

The method of claim may further include controlling, by a finite state machine (FSM), the MRU. The method of claim may further include transitioning, by the FSM, between an idle state, a record state, a redirect state, and a correct state. The method of claim may further include transitioning, by the FSM, from the idle state to the record state in response to at least the misprediction redirect. The method of claim may further include transitioning, by the FSM, from the idle state to the redirect state in response to at least the misprediction redirect and a hit in the tag CAM. In some embodiments, the misprediction redirect is referred to as a first misprediction redirect. The method of claim may further include transitioning, by the FSM, from the idle state to the correct state in response to at least a second misprediction redirect associated with the MRB. The method of claim may further include transitioning, by the FSM, from the idle state to the correct state in response to at least the second misprediction redirect associated with the MRB and a hit in the tag CAM.

The blocks or steps of a method or algorithm and functions described in connection with the embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

The following discussion is intended to provide a brief, general description of a suitable machine or machines in which certain aspects of the inventive concept can be implemented. Typically, the machine or machines include a system bus to which is attached processors, memory, e.g., RAM, ROM, or other state preserving medium, storage devices, a video interface, and input/output interface ports. The machine or machines can be controlled, at least in part, by input from conventional input devices, such as keyboards, mice, etc., as well as by directives received from another machine, interaction with a virtual reality (VR) environment, biometric feedback, or other input signal. As used herein, the term "machine" is intended to broadly encompass a single machine, a virtual machine, or a system of communicatively coupled machines, virtual machines, or devices operating together. Exemplary machines include computing devices such as personal computers, workstations, servers, portable computers, handheld devices, telephones, tablets, etc., as well as transportation devices, such as private or public transportation, e.g., automobiles, trains, cabs, etc.

The machine or machines can include embedded controllers, such as programmable or non-programmable logic devices or arrays, Application Specific Integrated Circuits (ASICs), embedded computers, smart cards, and the like. The machine or machines can utilize one or more connections to one or more remote machines, such as through a network interface, modem, or other communicative coupling. Machines can be interconnected by way of a physical and/or logical network, such as an intranet, the Internet, local area networks, wide area networks, etc. One skilled in the art will appreciate that network communication can utilize various wired and/or wireless short range or long range carriers and protocols, including radio frequency (RF), satellite, microwave, Institute of Electrical and Electronics Engineers (IEEE) 545.11, Bluetooth®, optical, infrared, cable, laser, etc.

Embodiments of the present inventive concept can be described by reference to or in conjunction with associated data including functions, procedures, data structures, application programs, etc. which when accessed by a machine results in the machine performing tasks or defining abstract data types or low-level hardware contexts. Associated data can be stored in, for example, the volatile and/or non-volatile memory, e.g., RAM, ROM, etc., or in other storage devices and their associated storage media, including hard-drives, floppy-disks, optical storage, tapes, flash memory, memory sticks, digital video disks, biological storage, etc. Associated data can be delivered over transmission environments, including the physical and/or logical network, in the form of packets, serial data, parallel data, propagated signals, etc., and can be used in a compressed or encrypted format. Associated data can be used in a distributed environment, and stored locally and/or remotely for machine access.

Having described and illustrated the principles of the inventive concept with reference to illustrated embodiments, it will be recognized that the illustrated embodiments can be modified in arrangement and detail without departing from such principles, and can be combined in any desired manner. And although the foregoing discussion has focused on particular embodiments, other configurations are contemplated. In particular, even though expressions such as "according to an embodiment of the inventive concept" or the like are used herein, these phrases are meant to generally reference embodiment possibilities, and are not intended to limit the inventive concept to particular embodiment configurations. As used herein, these terms can reference the same or different embodiments that are combinable into other embodiments.

Embodiments of the inventive concept may include a non-transitory machine-readable medium comprising instructions executable by one or more processors, the instructions comprising instructions to perform the elements of the inventive concepts as described herein.

The foregoing illustrative embodiments are not to be construed as limiting the inventive concept thereof. Although a few embodiments have been described, those skilled in the art will readily appreciate that many modifications are possible to those embodiments without materially departing from the novel teachings and advantages of the present disclosure. Accordingly, all such modifications are intended to be included within the scope of this inventive concept as defined in the claims.

What is claimed is:

1. A mispredict recovery apparatus, comprising:
one or more instruction execution units;
one or more branch predictors; and
a misprediction recovery unit (MRU) coupled to the one or more instruction execution units and to the one or more branch predictors, and configured to provide discrete cycle predictions after a misprediction redirect from the one or more instruction execution units, the MRU comprising:
a branch confidence filter configured to generate prediction confidence information for predicted branches based on information from the one or more branch predictors and on the misprediction redirect from the one or more instruction execution units;
a tag content-addressable memory (CAM) configured to:
store frequently mispredicting low-confidence branches;
probe the misprediction redirect from the one or more instruction execution units; and
obtain the prediction confidence information from the branch confidence filter associated with the frequently mispredicting low-confidence branches; and
a mispredict recovery buffer (MRB) configured to store an alternate path for the frequently mispredicting low-confidence branches present in the tag CAM,
wherein the MRU is configured to provide the discrete cycle predictions after the misprediction redirect based at least on the alternate path stored in the MRB.

2. The mispredict recovery apparatus of claim 1, wherein the alternate path diverges from a predicted path starting from a mispredicting branch from among the frequently mispredicting low-confidence branches.

3. The mispredict recovery apparatus of claim 2, further comprising an instruction fetch pipeline, wherein in response to the misprediction redirect from the one or more instruction execution units, the MRB is configured to drive the instruction fetch pipeline with the alternate path.

4. The mispredict recovery apparatus of claim 3, wherein the MRU is configured to provide the discrete cycle predictions to the instruction fetch pipeline from the MRB without bubble penalties.

5. The mispredict recovery apparatus of claim 1, wherein the MRB is configured to store instruction addresses for the alternate path without storing instructions themselves.

6. The mispredict recovery apparatus of claim 1, wherein the MRB is configured to store the alternate path immediately following the misprediction redirect.

7. The mispredict recovery apparatus of claim 1, wherein the MRB is configured to store a plurality of alternate paths each associated with a frequently mispredicting low-confidence branch from among the frequently mispredicting low-confidence branches present in the tag CAM.

8. The mispredict recovery apparatus of claim 1, further comprising:
a finite state machine (FSM) configured to control the MRU, and to transition between an idle state, a record state, a redirect state, and a correct state.

9. The mispredict recovery apparatus of claim 8, wherein the FSM is configured to transition from the idle state to the record state in response to at least the misprediction redirect.

10. The mispredict recovery apparatus of claim 8, wherein the FSM is configured to transition from the idle state to the redirect state in response to at least the misprediction redirect and a hit in the tag CAM.

11. The mispredict recovery apparatus of claim 8, wherein the misprediction redirect is referred to as a first misprediction redirect, and wherein the FSM is configured to transition from the idle state to the correct state in response to at least a second misprediction redirect associated with the MRB.

12. The mispredict recovery apparatus of claim 11, wherein the FSM is configured to transition from the idle state to the correct state in response to at least the second misprediction redirect associated with the MRB and a hit in the tag CAM.

13. A mispredict recovery apparatus, comprising:
one or more instruction execution units;
one or more branch predictors; and
a misprediction recovery unit (MRU) coupled to the one or more instruction execution units and to the one or more branch predictors, and configured to provide discrete cycle predictions after a misprediction redirect from the one or more instruction execution units, the MRU comprising:
a branch confidence filter configured to generate prediction confidence information for predicted branches based on information from the one or more branch predictors and on the misprediction redirect from the one or more instruction execution units;

a tag content-addressable memory (CAM) configured to:
  store frequently mispredicting low-confidence branches;
  probe the misprediction redirect from the one or more instruction execution units; and
  obtain the prediction confidence information from the branch confidence filter associated with the frequently mispredicting low-confidence branches;

a mispredict recovery buffer (MRB) configured to store an alternate path for the frequently mispredicting low-confidence branches present in the tag CAM; and one or more branch predictors, wherein the one or more branch predictors are configured to determine whether or not the alternate path is accurate, wherein in response to determining that the alternate path is not accurate, the one or more branch predictors are configured to correct the discrete cycle predictions sent to the instruction fetch pipeline.

14. The mispredict recovery apparatus of claim 13, wherein the MRU is configured to store the corrected discrete cycle predictions.

15. A method for recovering from mispredicts associated with an instruction fetch pipeline, the method comprising:
  receiving a misprediction redirect from the one or more instruction execution units;
  providing, by a misprediction recovery unit (MRU), discrete cycle predictions after the misprediction redirect received from the one or more instruction execution units;
  generating, by a branch confidence filter, prediction confidence information for predicted branches based on information from one or more branch predictors and on the misprediction redirect from the one or more instruction execution units;
  storing, by a tag content-addressable memory (CAM), frequently mispredicting low-confidence branches;
  probing, by the tag CAM, the misprediction redirect from the one or more instruction execution units;
  obtaining, by the tag CAM, the prediction confidence information from the branch confidence filter associated with the frequently mispredicting low-confidence branches;
  storing, by a mispredict recovery buffer (MRB), an alternate path for the frequently mispredicting low-confidence branches present in the tag CAM;
  driving, by the MRB, an instruction fetch pipeline with the alternate path in response to the misprediction redirect from the one or more instruction execution units;
  providing, by the MRU, the discrete cycle predictions to the instruction fetch pipeline from the MRB without bubble penalties;
  storing, by the MRB, instruction addresses for the alternate path without storing instructions themselves;
  storing, by the MRB, the alternate path immediately following the misprediction redirect from the one or more instruction execution units;
  determining, by the one or more branch predictors, whether or not the alternate path is accurate;
  in response to determining that the alternate path is not accurate, correcting, by the one or more branch predictors, the discrete cycle predictions sent to the instruction fetch pipeline; and
  storing, by the MRU, the corrected discrete cycle predictions.

16. The method of claim 15, further comprising:
  controlling, by a finite state machine (FSM), the MRU;
  transitioning, by the FSM, between an idle state, a record state, a redirect state, and a correct state;
  transitioning, by the FSM, from the idle state to the record state in response to at least the misprediction redirect;
  transitioning, by the FSM, from the idle state to the redirect state in response to at least the misprediction redirect and a hit in the tag CAM;
  wherein the misprediction redirect is referred to as a first misprediction redirect, the method further comprising:
  transitioning, by the FSM, from the idle state to the correct state in response to at least a second misprediction redirect associated with the MRB; and
  transitioning, by the FSM, from the idle state to the correct state in response to at least the second misprediction redirect associated with the MRB and a hit in the tag CAM.

* * * * *